United States Patent [19]

Sukashita et al.

[11] Patent Number: 5,173,870
[45] Date of Patent: Dec. 22, 1992

[54] TRANSMISSION AND LATCH CIRCUIT FOR LOGIC SIGNAL

[75] Inventors: Kazuhiro Sukashita; Yoshiki Tsujzhushi; Takeshi Hashizume, all of Hyogo, Japan

[73] Assignee: Mitsubishi Denki Kabushiki Kaisha, Tokyo, Japan

[21] Appl. No.: 489,385

[22] Filed: Mar. 5, 1990

[30] Foreign Application Priority Data

Mar. 9, 1989 [JP] Japan ................... 1-56704

[51] Int. Cl.⁵ .................. H03K 3/29; G06F 7/52
[52] U.S. Cl. .................. 364/754; 307/279; 307/291
[58] Field of Search ........... 307/279, 291, 494, 530; 364/768, 784, 757, 754

[56] References Cited

U.S. PATENT DOCUMENTS

| | | | |
|---|---|---|---|
| 4,209,715 | 6/1980 | Aoki | 307/291 |
| 4,215,418 | 7/1980 | Muramatsu | 364/757 |
| 4,333,020 | 6/1982 | Maeder | 307/279 |
| 4,356,411 | 10/1982 | Suzuki et al. | 307/279 |
| 4,506,167 | 3/1985 | Little et al. | 307/279 |
| 4,689,763 | 8/1987 | Fang | 364/784 |
| 4,740,907 | 4/1988 | Shimizu et al. | 364/784 |
| 4,754,165 | 6/1988 | Cornish | 307/291 |
| 4,831,577 | 5/1989 | Wei et al. | 364/784 |
| 4,831,579 | 5/1989 | Hara et al. | 364/784 |
| 4,860,327 | 8/1989 | Nakagawa et al. | 307/279 |
| 4,870,609 | 9/1989 | Yasui et al. | 364/784 |
| 4,887,233 | 12/1989 | Cash et al. | 364/784 |
| 4,939,384 | 7/1990 | Shikata et al. | 307/279 |
| 4,972,096 | 11/1990 | Takeshima et al. | 307/279 |

OTHER PUBLICATIONS

Millman, *Microelectronics Digital and Analog Circuits and Systems*, McGraw-Hill Book Co. New York, 1979, pp. 205-206.
Agrawal, D., "High-Speed Arithmetic Arrays", IEEE Trans. on Computers, vol. C-28 #3 pp. 215-224, Mar. 1979.
Integrated Electronics: "Analog and Digital Circuits and Systems", J. Millman, et al., pp. 624-627.
"Halbleiter-Schaltungstechnik", by U. Tietze, et al., 1974.

*Primary Examiner*—Dale M. Shaw
*Attorney, Agent, or Firm*—Lowe, Price, LeBlanc & Becker

[57] ABSTRACT

A latch circuit comprises two inverters having their input terminals connected to their respective output terminals, i.e. cross-coupled to each other. In data writing, two data signals which are complementary to each other and applied from a circuit block at a preceding stage are respectively applied to the input terminals of these inverters. In data holding, the two complementary data signals applied in data writing are held at the connecting point of the inverters, and two complementary data signals to be applied to a circuit block at a succeeding stage are derived from the output terminals of the inverters. Therefore, when the data signals applied to the respective inverters are inverted in data writing, a change in the potential of the input terminal of one of the inverters accelerates a change in the output potential of the other inverter. Accordingly, the two complementary data signals outputted from the circuit block at the preceding stage are transmitted rapidly to the circuit block at the succeeding stage via the same path, i.e., at the same rate.

10 Claims, 9 Drawing Sheets

TRANSMISSION AND LATCH CIRCUIT FOR LOGIC SIGNAL

BACKGROUND OF THE INVENTION

1. Field of the Invention

This invention relates generally to logic signal storage and transmission circuits, and more particularly to a logic circuit to control complementary signal propagation between a pair of circuit blocks.

2. Description of the Background Art

A full adder is known as one of typical logic circuits. The full adder is a circuit which carries out adding operation of a digital signal corresponding to inputted addend and a digital signal corresponding to augend in consideration of carry, and outputs a digital signal corresponding to the sum thereof. The full adder receives a carry signal representing the presence or absence of carry. This full adder is employed in an integer multiplier constituting, for example, a floating point multiplier and serves as an important circuit portion for determining an operation speed of the floating point multiplier.

FIG. 9 is a schematic block diagram showing a configuration of the integer multiplier. Referring to this figure, multiplicand X and multiplier Y are inputted to a full adder array 80 through input circuit portions 81 and 82, respectively, in this integer multiplier. The full adder array 80, comprising a large number of full adders arranged in matrix, evaluates partial products of the multiplicand X and the multiplier Y. The partial products evaluated in the full adder array 80 are inputted through a latch circuit 83 to a full adder 84. This full adder 84 adds all the partial products inputted through the latch circuit 83 and obtains the product X x Y of the multiplicand X and the multiplier Y. The final multiplication result X x Y obtained in the full adder 84 is outputted through an output circuit 85.

In recent years, it is made public that a full adder disclosed in U.S. Pat. No. 4,870,609 is employed as the full adder constituting the full adder array 80 for evaluating the partial products in order to increase the operation speed of the above described integer multiplier.

FIG. 8 is a circuit diagram showing a configuration of an improved full adder disclosed in U.S. Pat. No. 4,870,609. Referring to FIG. 8, a feature of this full adder is in that all input signals and output signals are constituted by complementary signal pairs. That is, this full adder receives an augend signal A and its inverse signal $\overline{A}$, an addend signal B and its inverse signal $\overline{B}$, and a carry-in signal $C_{in}$ and its inverse signal $\overline{C}_{in}$ and then evaluates the sum of the augend signal A and the addend signal B. The full adder then outputs the evaluated result as a sum signal S and its inverse signal $\overline{S}$, and a carry-out signal CO and its inverse signal $\overline{CO}$. Meanwhile, the conventional full adder receives an augend signal, an inverse signal of an addend signal, and a carry-in signal, in only either the non-inversion state or inversion state, evaluates the sum of the augend signal and the addend signal, and outputs this evaluated result as a sum signal and a carry-out signal in only either the non-inversion state or inversion state. In the foregoing conventional full adder, the inverse signal is formed in itself. Therefore, there is a problem in that the time taken to produce the inverse signal causes a delay in the adding operation.

On the other hand, since the full adder of FIG. 8 has such a configuration described above as to receive a complementary signal pair as its input, an effect is provided whereby the inverse signal does not need to be formed in the full adder and the full adder operation can be performed at a high speed. When this full adder different from the conventional one is employed for the full adder array 80 and the full adder 84 at the final stage in FIG. 9, each output of the full adder 80 becomes a complementary signal pair. Therefore, the latch circuit 83, provided between the full adder array 80 and the full adder 84 at the final stage, is required, if necessary, to hold the complementary signal pair and rapidly transmit the pair to the full adder 84 at the succeeding stage. Since the above described operation employing the complementary signal pair, in general, involves a risk that signal lines twice those in the conventional are required, it is mainly applied to a data execution unit of a CPU(Central Processing Unit) or to a circuit portion which requires a very high speed operation such as the multiplier described above. Therefore, the latch circuit included in this circuit portion need function to more rapidly transmit the complementary signal pairs to the succeeding stage than in the conventional.

FIG. 5 is a circuit diagram of one example of a conventional latch circuit. Referring to FIG. 5, the latch circuit comprises a data amplifying inverter 1 for amplifying an input data signal D (a digital signal of the potential level, logical high (the "H" level) or logical low (the "L" level), a data holding portion 29d for holding the input data signal D as data, and data amplifying inverters 3 and 4 for amplifying the data held by the data holding portion 29d and outputting the data to a circuit in the succeeding stage as output data signals Q and $\overline{Q}$ which are complementary to each other.

The data holding portion 29d comprises an input terminal 5, output terminals 7 and 8, a transmission gate 26 having a parallel connection of a P channel MOS transistor and an N channel MOS transistor, write control terminals 24 and 25 to be supplied with a complementary signal pair T and $\overline{T}$ for controlling ON/OFF of the transmission gate 26, and data holding inverters 22 and 23 for holding data inputted from the input terminal 5. The input terminal of the data holding inverter 22 is connected to the output terminal of the data holding inverter 23, while the output terminal of the data holding inverter 22 is connected to the input terminal of the data holding inverter 23. A connecting point of the output terminal of the inverter 22 and the input terminal of the inverter 23 is connected to the output terminal $\theta$. Further, the input terminal 5 is connected to a connecting point (node i) of the input terminal of the inverter 22 and the output terminal of the inverter 23 via the transmission gate 26. A connecting point (node j) of the output terminal of the inverter 22 and the input terminal of the inverter 23 is connected to the output terminal 8. The write control terminals 24 and 25 are respectively connected to the gates of the N channel MOS transistor and P channel MOS transistor constituting the transmission gate 26.

The output terminal of the inverter 1 is connected to the input terminal 5 of the data holding portion 29d, and the input terminals of the inverter 3 and 4 are respectively connected to the output terminals 7 and 8 of the data holding portion 29d.

The operation of this circuit will be described hereinafter.

When potential levels of "H" and "L" are respectively applied to the write control terminals 24 and 25 as the signals T and T̄, the N channel MOS transistor and P channel MOS transistor constituting the transmission gate 26 are turned on, so that the transmission gate 26 is turned on. Meanwhile, the input data signal D to be written is inverted and amplified by the inverter 1 and transmitted to the input terminal 5. As a result, an inverted signal D̄ of the input data signal transmitted to the input terminal 5 is transmitted to the input terminal of the inverter 22. The data signal transmitted to the input terminal of the inverter 22 is inverted by the inverter 22 and further inputted to the inverter 23. That is, the potential levels on the nodes i and j are determined by the input data signal D. This is called a data write-in state. If the input data signal written as above is held not to change responsive to a signal inputted later to the input terminal 5, the potential levels of the signals T and T̄ applied to the write control terminals 24 and 25 are respectively inverted to be the "L" level and the "H" level. Accordingly, the transmission gate 26 is turned off, and further, the signal inputted to the input terminal 5 is not transmitted to the input terminal of the inverter 22. Meanwhile, the output of inverter 23 is fed back to the input terminal of the inverter 22. Therefore, the potential level on the node i is kept at the level in the write-in state responsive to the output of the inverter 23. In addition, the potential level on the node j is also kept at the level of the write-in state. That is, the input data signal inputted in advance is held at the connecting point of the inverters 22 and 23. This is called a data holding state.

As mentioned above, switching on/off the transmission gate 26 allows the switching between the data write-in state and the data holding state. The input data signal is derived from the output terminals 7 and 8. In other words, a signal to which the input data signal D is inverted and amplified by the inverter 1 is derived from the output terminal 7, and a signal inverted from this derived signal is derived from the output terminal 8. The signals of the complementary signal pair derived as above are respectively inverted and amplified by the inverters 3 and 4 and inputted to the adder in the succeeding stage.

When the data held by the inverters 22 and 23 is rewritten, the write control terminals 24 and 25 are supplied with the same signal as in the data write-in state, so that the transmission gate 26 is turned on and a data signal to be newly written is inputted to the inverter 1. Furthermore, if this newly written data is to be held, the same signal as in the data holding state is applied to the write control terminals 24 and 25.

A description will now be given on the relationship of "current handling capabilities" among the inverters 1, 22 and 23. The current handling capability of the transistor means the amount of current that the inverter is capable of carrying from the power supply to ground. As this amount of current increases, that is, as ON resistance of the transistor constituting the inverter increases, the current handling capability of the inverter increases. The current handling capability of the inverter 23 is lower than that of the inverter 22. This is possible because the inverter 23 is reliably operated responsive to the output of the inverter 22. Further, adjustments of the current handling capabilities of the inverters 1 and 23 are also required because such a case should be considered that the input data signal which is held is rewritten in response to the inverted signal thereof, i.e. a new input data signal. In this case, the potential level on the node i held by the output of the inverter 23 is opposite to the potential level transmitted to the input terminal 5 by the inverter 1 which received the new input data signal. Therefore, if the current handling capability of the inverter 23 is higher than that of the inverter 1, the potential level on the node i is hard to change with the output of the inverter 1. Accordingly, the potential on the node j is also hard to change with the input of the new data signal. That is to say, a problem arises that the new input data signal takes a long time to be written in the data holding portion 29d, or the correct writing may not be carried out. In order to eliminate this problem, the current handling capabilities of the inverters 1 and 23 should also be adjusted to each other. Therefore, the current handling capabilities of the inverters 1, 22 and 23 are adjusted to one another.

The conventional latch circuit for outputting complementary data signal pairs is configured as described above and involves such problems as follows.

FIG. 6 shows the conventional latch circuit shown in FIG. 5 in which the inverters 1 and 23 are shown in further detail. Referring to the figure, the inverter 1 comprises a series connection of a P channel MOS transistor Q1 and an N channel MOS transistor Q2, which is provided between high and low voltage sources 27 and 28. Similarly, the inverter 23 comprises a series connection of a P channel MOS transistor Q3 and an N channel MOS transistor Q4, which is provided between the high and low voltage sources 27 and 28.

FIG. 7 is a graph showing the relationship between the potentials on the nodes i and j in the latch circuits shown in FIGS. 5 and 6. In these figures, the abscissa designates a potential $V_i$ on the node i, and the ordinate designates a potential $V_j$ on the node j. Disadvantages involved in the conventional latch circuit will now be described with reference to FIGS. 6 and 7.

Assuming that the potential level on the node i is kept at the "L" level by the inverters 22 and 23 in the data holding state, the output potential level of the inverter 22 attains the "H" level, that is, the potential level on the node j attains the "H" level responsive to the potential level "L" on the node i. Furthermore, the transistor Q4 in the inverter 23 is turned on responsive to the potential level "H" on the node j. Accordingly, the output potential level of the inverter 23 goes to the "L" level, and the potential level on the node i is kept at the "L" level. Such a case is considered that the described data holding state turns to the data write-in state, so that the transmission gate 26 is turned on. At this time, if the potential level of the input data signal D inputted to the inverter 1 is at the "L" level, the transistor Q1 is turned on. Meanwhile, the transmission gate 26 is on, and the transistor Q4 constituting the inverter 23 is also on. Therefore, a current flows from the high voltage source 27 through the transistors Q1 and Q4 to the low voltage source 28. Accordingly, the potential level on the node i is determined by the ratio of ON resistance values of the transistor Q1 to the transistor Q4. Thus, if the resistance value of the transistor Q4 is set larger than that of the transistor Q1, since the amount of current flowing though the transistor Q4 is smaller than the current flowing through the transistor Q1, a high potential that the transistor Q1 supplies from the high voltage source 27 to the node i is hard to be lowered by the transistor Q4 which is rendered conductive in response to the potential on the node j, when the potential level of the input data signal D goes to the "L" level. Accordingly, the potential level on the node i goes rapidly to the "H" level, and thus the output potential level of the inverter 22 goes to the "L" level rapidly. Referring to FIG. 7, the potential $V_j$ on the node j undergoes a complementary change with the potential $V_i$ on the node i. Therefore, the rapid change of the potential $V_i$ on the node i from the "L" level to the "H" level means that the input data signal D is transmitted rapidly to the output terminals 7 and 8. However, when the potential level of the input data signal D attains the "H" level in the write-in state, the transistor Q2 comprised in the inverter 1 is turned on so as to transmit the potential level "L" level of the low voltage source 28 to the node i. Finally, the potential level on the node i goes to the "L" level while the potential level on the node j goes to the "H" level, and thus the transistor Q4 comprised in the inverter 23 should be turned on. Namely, the larger the current handling capability of the transistor Q4 is, the faster the input data signal D is transmitted to the output terminals 7 and 8. However, the current handling capability of the transistor Q4 decreases according as ON resistance value of the transistor Q4 increases. That is, the potential level on the node i slowly goes to the "L" level. In addition, the potential level on the node j also goes slowly to the "H" level. It means that the transmission rate of the input data signal D decreases when its potential level is in the "H" level.

On the other hand, assuming that the potential level on the node i is kept at the "H" level by the inverters 22 and 23 in the data holding state, the output potential level of the inverter 22 attains the "L" level, that is, the potential level on the node j attains the "L" level responsive to the potential level "H" on the node i. Furthermore, the transistor Q3 in the inverter 23 is turned on responsive to the potential level "L" on the node j. Accordingly, the output potential level of the inverter 23 goes to the "H" level, and the potential level on the node i is kept at the "H" level. Such a case is considered that the described data holding state turns to the data write-in state, so that the transmission gate 26 is turned on. At this time, if the potential level of the input data signal D inputted to the inverter 1 is at the "H" level, the transistor Q2 is turned on. Meanwhile, the transmission gate 26 is on, and the transistor Q3 constituting the inverter 23 is also on. Therefore, a current flows from the high voltage source 27 through the transistors Q3 and Q2 to the low voltage source 28. Accordingly, the potential level on the node i is determined by the ratio of ON resistance values of the transistor Q2 to the transistor Q3. Thus, if the resistance value of the transistor Q2 is set smaller than that of the transistor Q3, since the amount of current flowing through the transistor Q2 is larger than that flowing through the transistor Q3, a high potential that the transistor Q3 supplies from the high voltage source 27 to the node i is easily lowered by the transistor Q2, when the potential level of the input data signal D goes to the "L" level. Accordingly, the potential level on the node i goes rapidly to the "L" level, and thus the output potential level of the inverter 22 also goes to the "H" level rapidly. This means that the input data signal D is transmitted rapidly to the output terminals 7 and 8. However, when the potential level of the input data signal D attains the "L" level in the write-in state, the transistor Q1 comprised in the inverter 1 is turned on so as to transmit the potential level "H" level of the high voltage source 27 to the node i. Finally, the potential level on the node i goes to the "H" level while the potential level on the node j goes to the "L" level, and thus the transistor Q3 comprised in the inverter 23 should be turned on. Therefore, in this case, the potential level on the node i is easily raised to the "H" level by the transistor Q3 which renders conductive in response to the potential level on the node j. That is to say, the larger the current handling capability of the transistor Q3 is, the faster the input data signal D is transmitted to the output terminals 7 and 8. However, the current handling capability of the transistor Q3 decreases according as ON resistance value of the transistor Q3 increases. That is, if the resistance value of the transistor Q3 is set small, the potential level on the node i slowly goes to the "H" level. In addition, the potential level on the node j also goes slowly to the "L" level. This means that the transmission rate of the input data signal D decreases when its potential level is at the "L" level.

As described above, the faster the signal of the potential level "L" applied as the input data signal D is transmitted, the slower the signal of the potential level "H" is transmitted. On the other hand, the faster the signal of the potential level "H" is transmitted, the slower the signal of the potential level "L" is transmitted. That is to say, there is a limit to enhance the transmission rates of the both signals of the potential levels "L" and "H". As a result, there is a problem that the transmission rate of the input data signal is low in the conventional latch circuit.

Moreover, the following problem arises in the conventional latch circuit when a complementary signal pair, i.e. two output signals are inputted to a circuit at the same succeeding stage which requires the same simultaneously. That is to say, as seen from FIG. 5, one signal of the above described complementary signal pair is derived from the input terminal of the inverter 22, while the other is derived from the output terminal of the inverter 22. Therefore, a difference by a delay time in the inverter 22 occurs in the time required for transmitting each of the signals of the above described complementary signal pair to the circuit at the above described succeeding stage. This is undesirable because the circuit at the succeeding stage which requires two complementary signals at the same time causes a delay in transmission of the signals.

SUMMARY OF THE INVENTION

It is one object of this invention to provide a logic signal storage and transmission circuit for rapidly transmitting an input data signal between successive circuit stages.

It is another object to provide a logic signal storage and transmission circuit interconnecting successive circuit stages for passing therebetween at a high rate of transmission changes in logic signal levels in either direction.

Another object is to provide a logic signal storage and transmission circuit for transmitting complementary signal pairs between successive circuit stages.

A further object of the invention is to provide a high speed full adder circuit incorporating an improved logic signal storage and transmission circuit between successive adder circuit stages.

A still further object of the invention is to provide a high speed multiplier circuit incorporating an improved logic signal storage and transmission circuit.

This invention is directed to a logic signal storage and transmission circuit having complementary input terminals for receiving complementary input signals and complementary output terminals for providing corresponding complementary output signals. This logic signal storage and transmission circuit comprises an interconnection circuit for establishing first and second signal flow paths respectively between the complementary input and output terminals, a data holding circuit including a cross-coupled pair of logic elements in the interconnection circuit for holding a complementary data pair from the input terminals, and a circuit for controlling the data holding circuit.

According to this invention, the data holding circuit comprises a first inverting circuit for receiving one of the complementary data pair for inverting the data thereof, and a second inverting circuit for receiving the other one of the complementary data pair for inverting the data thereof. An output of the first inverting circuit is coupled to an input of the second inverting circuit, and an output of the second inverting circuit is coupled to an input of the first inverting circuit.

According to a preferred embodiment, the circuit for controlling the data holding circuit comprises a first transmission gate connected between one of the complementary data pair, which is transmitted from one of the complementary input terminals and the input of the first inverting circuit, a second transmission gate connected between the other data from the other input terminals and the input of the second inverting circuit, and a control signal input terminal connected in common to the first and second transmission gates for receiving a control signal for controlling ON/OFF thereof.

According to a still further preferred embodiment, the first and second transmission gates preferably each comprise one N channel MOS transistor or one P channel MOS transistor. The MOS transistors of the first and second transmission gates have their gate terminals connected to the control signal input terminal.

Further, according to another preferred embodiment, the first and second transmission gates each comprise an N channel MOS transistor and a P channel MOS transistor having their respective sources connected in common and their respective drains connected in common.

According to another preferred embodiment, the data holding circuit comprises first and second NOR circuits each having two inputs, and the circuit for controlling the data holding circuit comprises a first transmission gate connected between one of the complementary data pair, which is transmitted from one of the complementary input terminals, and one input of the first NOR circuit, a second transmission gate connected between the other complementary data from the other input terminal and one input of the second NOR circuit, and a control signal input terminal connected in common to the first and second transmission gates for receiving a control signal for controlling ON/OFF thereof. An output of the first NOR circuit is connected to one input of the second NOR circuit, an output of the second NOR circuit is connected to one input of the first NOR circuit, the other input of the first NOR circuit is connected to a first external control input terminal, and the other input of the second NOR circuit is connected to a second external control input terminal.

According to the particular aspect of the invention, a logic signal storage and transmission circuit in accordance with this invention comprises a complementary signal input terminal pair for receiving a complementary data pair, a complementary signal output terminal pair for outputting a complementary signal, a first inverter circuit having its input connected to one terminal of the complementary signal input terminal pair, and a second inverter circuit having its input connected to the other terminal of the complementary signal input terminal pair. The first inverter circuit has its output connected to one terminal of the complementary signal output terminal pair, the second inverter circuit having its output connected to the other terminal of the complementary signal output terminal pair, the first inverter circuit having its input connected to the output of the second inverter circuit, the second inverter circuit having its input connected to the output of the first inverter circuit. This logic signal storage and transmission circuit further comprises a first MOS transistor connected between one terminal of the complementary signal input terminal pair and the input of the first inverter circuit connected thereto, a second MOS transistor with the same conductivity type as that of the first MOS transistor, connected between the other terminal of the complementary signal input terminal pair and the input of the second inverter circuit connected thereto, and a control signal input terminal connected in common to the gates of the first and second MOS transistors for receiving a control signal for controlling ON/OFF thereof.

The logic signal storage and transmission circuit according to this invention as described above is preferably employed in a multiplier which requires complementary data propagation, as a latch circuit for holding an output of a partial product evaluating circuit for outputting partial products of multiplier data and multiplicand data as a complementary data pair, and transmitting an input of a partial product sum evaluating circuit for evaluating the sum of the partial products, or alternatively employed as a latch circuit for controlling complementary data propagation between full adders having input signals and output signals as complementary data. In addition, the logic signal storage and transmission circuit, when employed as the former latch circuit, has its complementary input terminals and output terminals connected respectively to the output of the partial product evaluating circuit and the input of the partial product sum evaluating circuit.

Meanwhile, the logic signal storage and transmission circuit according to the present invention, when employed as the latter latch circuit, has the complementary input and output terminals connected respectively to an output of at least the other one of the full adders and an input of at least one of the full adders, which is different from the former full adder.

The logic signal storage and transmission circuit in accordance with this invention has such configuration as described above, so that when provided between a plurality of circuit blocks to carry out complementary data propagation, the logic circuit can input a complementary data pair, hold it in a common data holding portion and output as the complementary data pair rapidly to the circuit in the succeeding stage.

Furthermore, according to the logic signal storage and transmission circuit in accordance with this invention, two input data signals which are complementary to each other are held in the same data holding portion, so that these signals are transmitted to the circuit in the succeeding stage at the same rate. Therefore, if the circuit in the succeeding stage is one which requires the complementary data signal pair at the same time, the transmission rate of the signals to the circuit in the succeeding stage increases, and thus the operational speed of the circuit in a succeeding stage also increases, resulting in an enhancement in the operational speed of the whole set of the logic circuit with the preceding and succeeding stages connected thereto. Therefore, when the logic signal storage and transmission circuit according to the present invention is, for example, employed in the multiplier for carrying out an operation using the complementary signal pair or as a data holding/propagating circuit between the full adders for carrying out an adding operation using the complementary signal pair, the operation speed in the whole of the multiplier and the adders is further increased.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
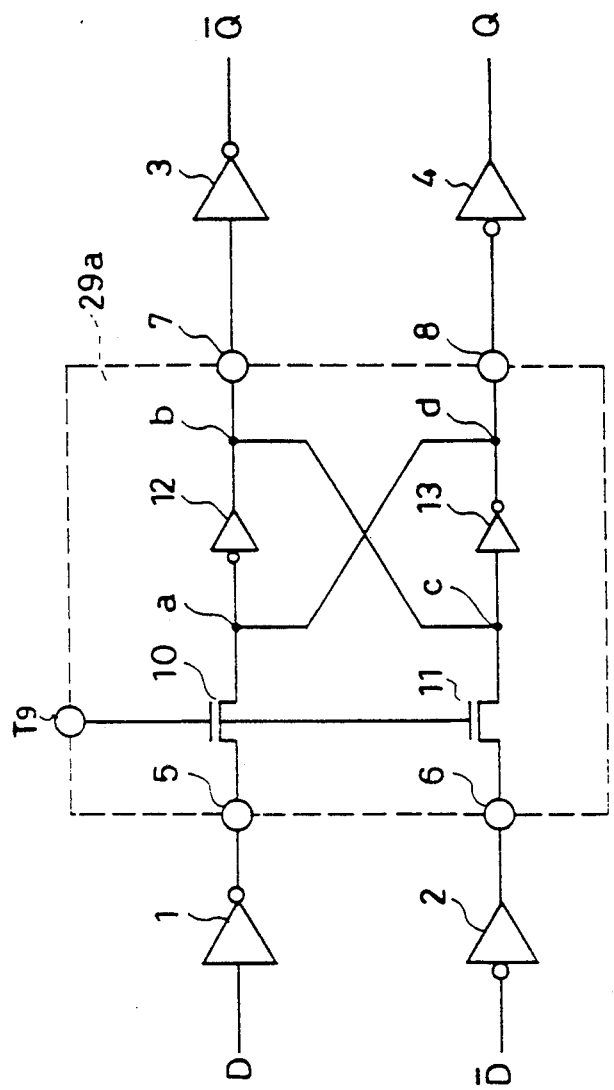
FIG. 1 is a logic circuit diagram of a first embodiment of this invention.

FIG. 1 is a circuit diagram of a latch circuit illustrating a first embodiment of a logic circuit device of this invention.

Referring to FIG. 1, this latch circuit comprises a data amplifying inverter 1 for amplifying an input data signal D, a data amplifying inverter 2 for amplifying an inverted signal $\overline{D}$ of the input data signal D, a data holding portion 29a for holding input data, and data amplifying inverters 3 and 4 for inverting and amplifying each of complementary output signal pairs from the data holding portion 29a to transmit as complementary signals Q and $\overline{Q}$ to the succeeding stage.

The data holding portion 29a comprises input terminals 5 and 6, output terminals 7 and 8, N channel MOS transistors 10 and 11, and inverters 12 and 13. Furthermore, the data holding portion 29a comprises a write control terminal 9 to which a signal T for simultaneously turning on/off the N channel MOS transistors 10 and 11 is inputted.

The inverters 12 and 13 have their input terminals cross-coupled to their respective output terminals. The input terminal 5 is connected to the input terminal of the inverter 12 via the transistor 10, and the input terminal 6 is connected to the input terminal of the inverter 13 via the transistor 11. Further, the inverter 12 and 13 have their output terminals respectively connected to the output terminals 7 and 8. The transistors 10 and 11 have their gates connected to the write control terminal 9. The inverters 1 and 2 have their output terminals respectively connected to the input terminals 5 and 6, and the inverters 3 and 4 have their input terminals respectively connected to the output terminals 7 and 8.

The operation of this circuit in a data write-in state will now be described with reference also to FIGS. 2(a)–2(i). FIGS. 2(a) to 2(i) show an example of changes in potential levels of the input data signals D, $\overline{D}$, a signal T nodes a, b, c and d, and output signals Q, $\overline{Q}$. The potential level of the signal T applied to the write control terminal 9 rises to the "H" level (referred to FIG. 2(c)). In response to this, the transistors 10 and 11 are turned on. Therefore, when the signal T rises, the input data signal D (FIG. 2(a)) is inverted and amplified by the inverter 1 and inputted to the inverter 12 via the input terminal 5 and the transistor 10. At the same time when the signal T rises, the input data signal $\overline{D}$ (FIG. 2(b)) is inverted and amplified by the inverter 2 and inputted to the inverter 13 via the input terminal 6 and the transistor 11. Accordingly, the potential level on the nodes a and d is equal to the potential level applied to the input terminal 5 (referred to FIGS. 2(d), 2(g)), while the potential on nodes b and c is equal to the potential level applied to the input terminal 6 (referred to FIGS. 2(b), 2(c)). As a matter of course, these two potential levels are complementary to each other. The respective potential levels on the nodes a, b, c and d are determined as above. That is to say, the input data signals D and $\overline{D}$ which are complementary to each other are written in the data holding portion 29a. The potentials of the complementary level are thus transmitted to the output terminals 7 and 8, simultaneously. Therefore, the output signals Q and $\overline{Q}$ are transmitted to a circuit in the succeeding stage at the same rate (referred to FIGS. 2(h), 2(i)), unlikely to the conventional manner.

Next, the operation of the circuit in a data holding state will be described. The potential level of the signal T is now changed to the "L" level, and the transistors 10 and 11 are turned off. Accordingly, as is conventional, the potential levels on the nodes a, b, c, and d, i.e. the data written in advance is not changed responsive to the change of the signal inputted later to the input terminals 5 and 6 while the signal T is "L". Meanwhile, the inverters 12 and 13 have their respective outputs mutually connected to the other respective inputs. Therefore, the potential level applied to the node a by previous input data is kept due to the output of the inverter 13. Similarly, the potential level applied to the node c by the previous input data is kept responsive to the output of the inverter 12. In addition to this, the potential levels on the nodes b and d are kept at the level in the data write-in state. That is, the complementary input data signal pair D and $\overline{D}$, when the signal T rises, is held at the connecting points b and d of the inverters 12 and 13.

Furthermore, the signals of the complementary input data signal pair which is held are derived respectively from the input terminals 7 and 8. The signal derived from the output terminal 7 is inverted and amplified by the inverter 3 to be inputted to the circuit in the succeeding stage, and the signal derived from the output terminal 8 is inverted and amplified by the inverter 4 to be inputted to a circuit in the succeeding stage.

Figure 2:
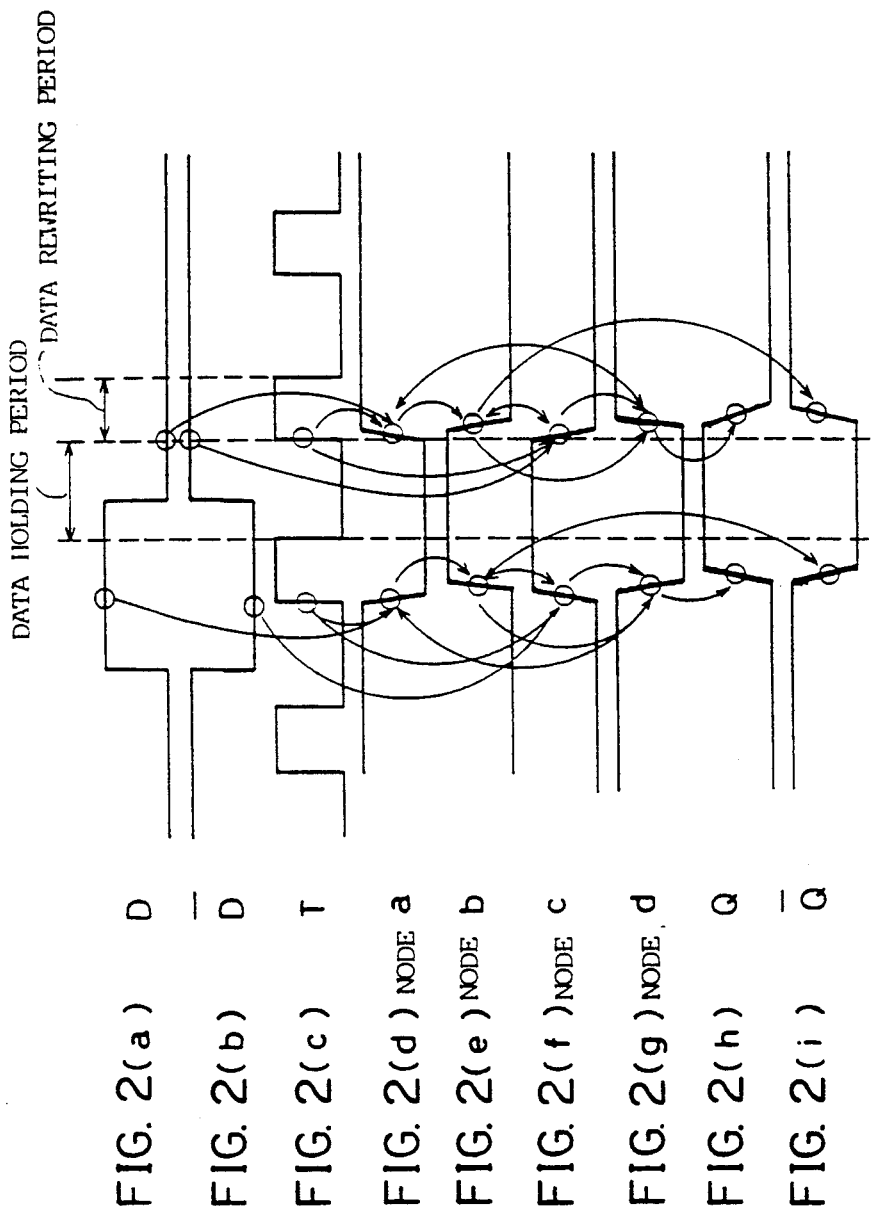
FIGS. 2(a)–2(i) are timing signals drawn for describing the operation of a latch circuit of FIG. 1.

Next, when the data held by the inverters 12 and 13 is rewritten, the potential level of the signal T goes to the "H" level again (see FIG. 2(c)), and the signals of the complementary input data signal pair to be newly written are inputted respectively to the inverters 1 and 2. The operation of the circuit in holding the newly written data while the signal T is "H" is the same as that in the data holding state described previously.

Next, the operation of the circuit when the data holding state turns to the write-in state will be described in detail. Referring to FIGS. 2(a)-2(i), such a case is considered, for example that the potential level on the node a (d) is kept at the "L" level, and the potential level on the node b (c) is at the "H" level in the data holding state. When this state turns to the data write-in state, and the transistors 10 and 11 are turned on, the following occurs if the potential levels of the complementary input data signal pair D and $\overline{D}$ inputted to the inverters 1 and 2 are at the "L" level and the "H" level, respectively. The potential on the node a tends to rise to the "H" level responsive to the output of the inverter 1. On the other hand, the potential on the node c tends to fall to the "L" level responsive to the output of inverter 2. As a result, the potential on the node b tends to fall down to the "L" level responsive to the output of the inverter 12, while the potential on the node d tends to rise to the "H" level responsive to the output of inverter 13. Further, the nodes a and d are connected to each other, while the nodes b and c are also connected to each other. Therefore, the potential on the node a rises accelerated by rising of the potential on the node d. As a result, the potential on the node b falls rapidly to the "L" level. That is, the input data signal inputted to the inverter 1 is transmitted rapidly to the output terminal 7. Similarly, the potential on the node c falls down accelerated by the falling of the potential on the node b. As a result, the potential on the node d rises rapidly to the "H" level. Accordingly, the input data signal D inputted to the inverter 2 is transmitted rapidly to the output terminal 8.

In contrast with the above example, when the state in which the potential level on the node a is kept at the "H" level while that of the node c is at the "L" level turns to the data write-in state, and the input data signal D attains the "H" level while the input data signal $\overline{D}$ falls to the "L" level, the nodes a and d and the nodes b and c accelerate with each other the changes of the potentials levels due to the new input data signal, as in the above example. Therefore, the complementary input data signal pair D and $\overline{D}$ are transmitted to the output terminals 7 and 8 as in the above example. However, changes of the potentials on the respective nodes are inevitably opposite to those in the previous example.

Furthermore, the characteristics of the circuit described above make the following possible. That is to say, in this latch circuit, if the transmission rate of either of the signals of the potential levels "L" and "H" increases, the transmission rate of the input data signals in the entire circuit increases. Namely, since the input data signals D and $\overline{D}$ are complementary to each other, the transmission rate of either the input data signal D or $\overline{D}$ increases due to the increased transmission rate of the signal of the potential level either "L" or "H". This means that the potential of either of the nodes a and b or the nodes c and d changes rapidly. Meanwhile, the changes of the potentials on the nodes a and d are accelerated with each other, while the changes of the potentials on the nodes c and d are accelerated with each other. Therefore, if the transmission rate of the signal of the potential level either "L" or "H" increases, the transmission rate of the input data signals in the entire circuit is enhanced inevitably.

In this embodiment, the N channel MOS transistors 10 and 11 are employed as switching means for switching the data write-in state and the data holding state. Generally, the transmission rate of the signal of the potential level "L" is high in the N channel MOS transistor. Therefore, if the potential level of the signal applied to the input terminal 5 is the "L" level in the data write-in state, the rapid changes of the potentials on the nodes a and b accelerate the changes of the potentials on the nodes c and d. On the other hand, if the potential level of the signal applied to the input terminal 6 is the "L" level, the rapid changes of the potentials on the nodes c and d accelerate the changes of the potentials on the nodes a and b. Furthermore, in contrast with this embodiment, the same effect is also achieved by employment of the P channel MOS transistor with a high transmission rate of the signal of the potential level "H" as the above described switching means. However, this case is opposite from the case in which the N channel MOS transistor is employed as the switching means in that the changes of the potentials on the nodes connected to one of the input terminals 5 and 6, to which the potential level "H" is applied, accelerate the changes of the potentials on the nodes connected to the other input terminal. In addition, by employing a single transistor in place of a transmission gate comprising the conventional P channel MOS transistor and N channel MOS transistor as the switching means, only one signal may be required to simultaneously turn on/off the above two switching means. That is, the complementary signal pair of T and $\overline{T}$ need not be employed as in the conventional example. As a result, the two complementary signals T and $\overline{T}$ do not need the adjustment of the timings to be applied to the above described switching means as in the conventional example.

Figure 3:
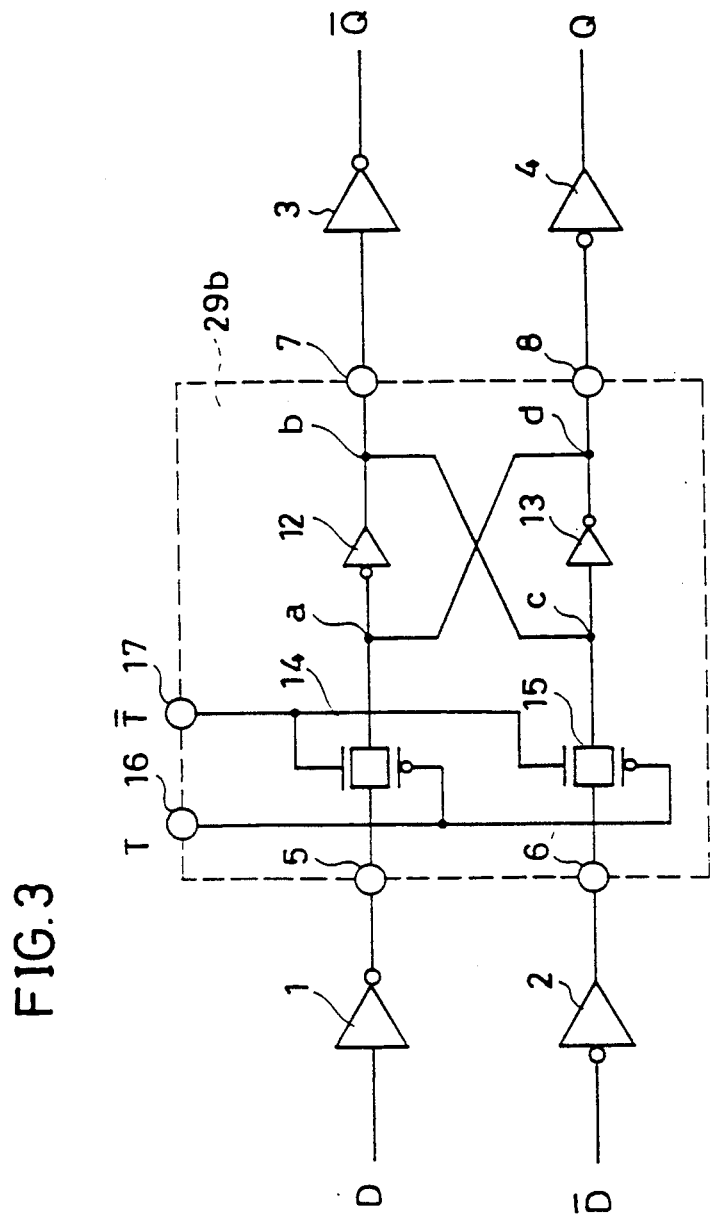
FIG. 3 is a logic circuit diagram of a second embodiment of this invention.

However, the same transmission gate as in the conventional example can also be employed as the switching means. FIG. 3 is a circuit diagram of a latch circuit of a second embodiment of this invention. Referring to the figure, this latch circuit employs transmission gates 14 and 15 each constituted by P channel and N channel MOS transistors in place of the N channel MOS transistors 10 and 11 in the latch circuit shown in FIG. 1. The respective P channel MOS transistors of the transmission gates 14 and 15 have their gates connected to a write control terminal 16. Further, the respective N channel MOS transistors of the transmission gates 14 and 15 have their gates connected to a write control terminal 17. Signals applied to the write control terminals 16 and 17 are, respectively, signals T and $\overline{T}$ which are complementary to each other. The other part of this circuit is the same as that of the latch circuit shown in FIG. 1. In the data write-in state of this latch circuit, signals of the potential levels "L" and "H" are respectively applied to the signals T and $\overline{T}$, so that the transmission gates 14 and 15 are turned on. In the data holding state, signals of the potential levels "H" and "L" are respectively applied to the signals T and $\overline{T}$, so that the transmission gates 14 and 15 are turned off. The operation of the other portions of the circuit in the data write-in state and in the data holding state is the same as the one described in the previous embodiment.

Adjustments in the current handling capabilities of the elements in the latch circuits of the above described first and second embodiments are performed between the inverters 1 and 13 and between the inverters 2 and 12, for the same reason as conventional. However, the adjustments in the current handling capabilities between the inverters 12 and 13 constituting the data holding portion 29a are unnecessary, as different from the conventional example. These are due to the fact, unlikely to the conventional example, that since the input data signals are not only applied to one of the two inverters constituting the data holding portion 29a but also to both of them, the output of one of the inverters does not control the operation of the other inverter, unlikely to the conventional example. Therefore, the adjustments of the current handling capabilities between the elements become much easier than in the conventional example.

Figure 4:
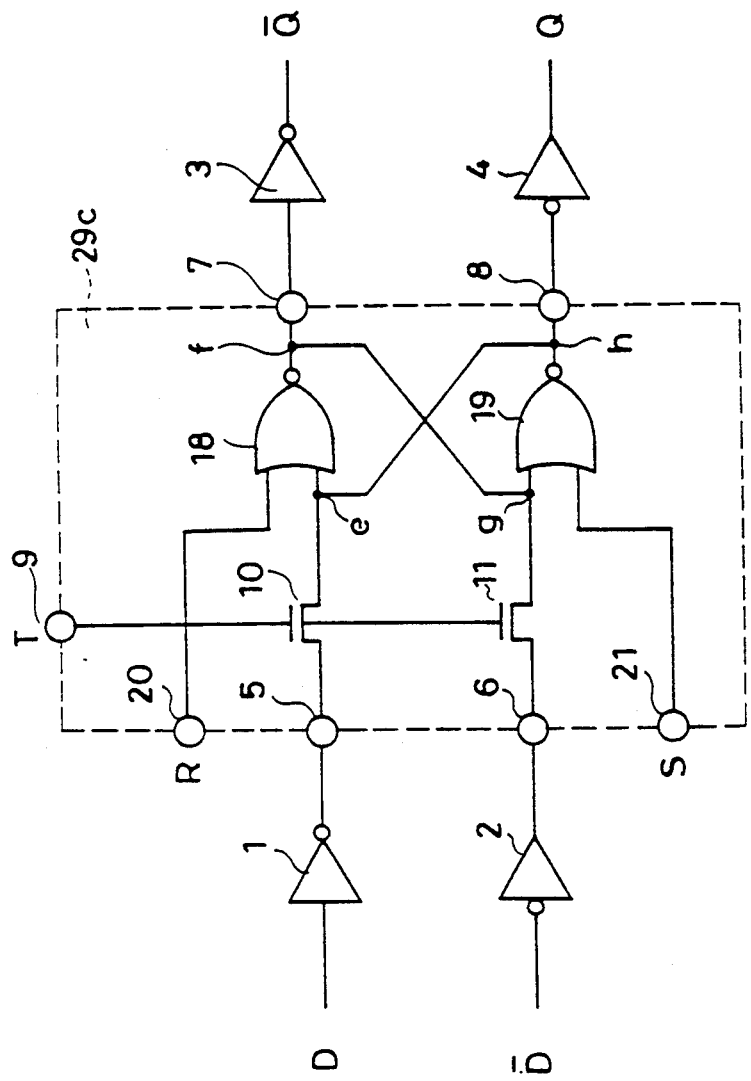
FIG. 4 is a logic circuit diagram of a third embodiment of this invention.
Figure 5:
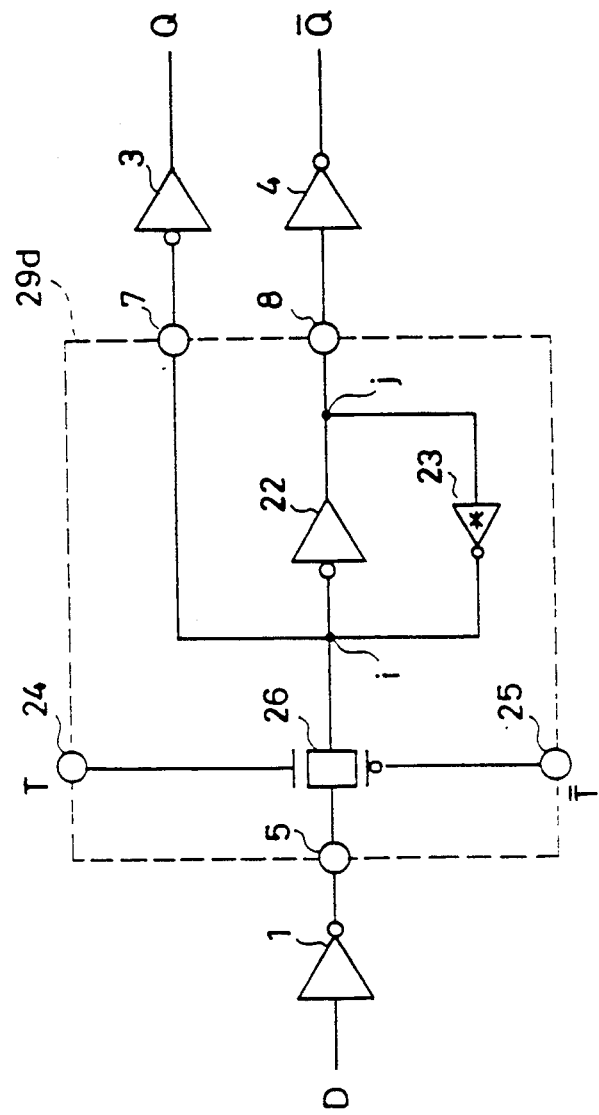
FIG. 5 is a logic circuit diagram of one example of a conventional latch circuit.
Figure 6:
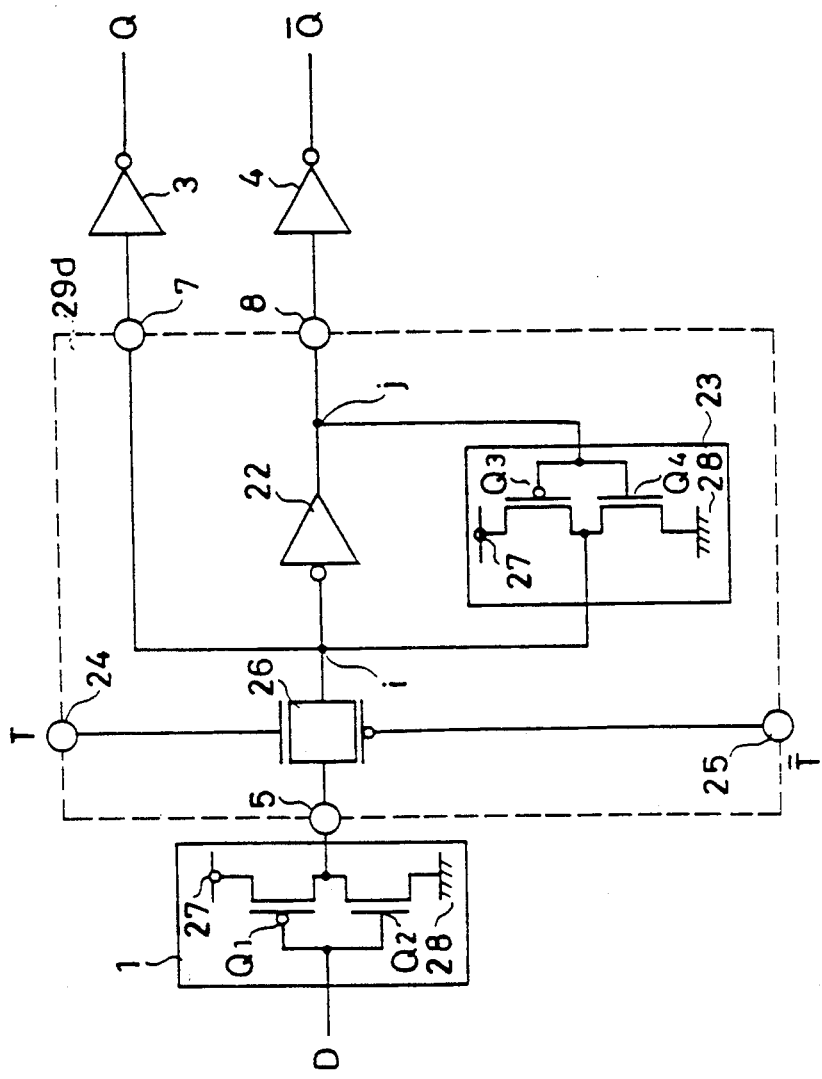
FIG. 6 is a circuit diagram of a portion of the circuit shown in FIG. 5 by employing elements.
Figure 7:
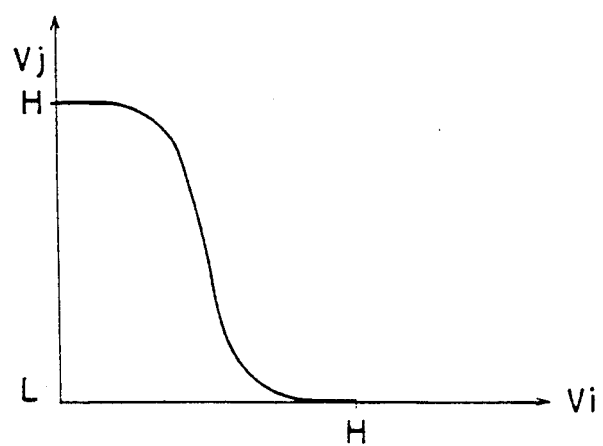
FIG. 7 is a diagram showing the relationship between potentials on nodes i and j in the latch circuit of FIG. 5.
Figure 8:
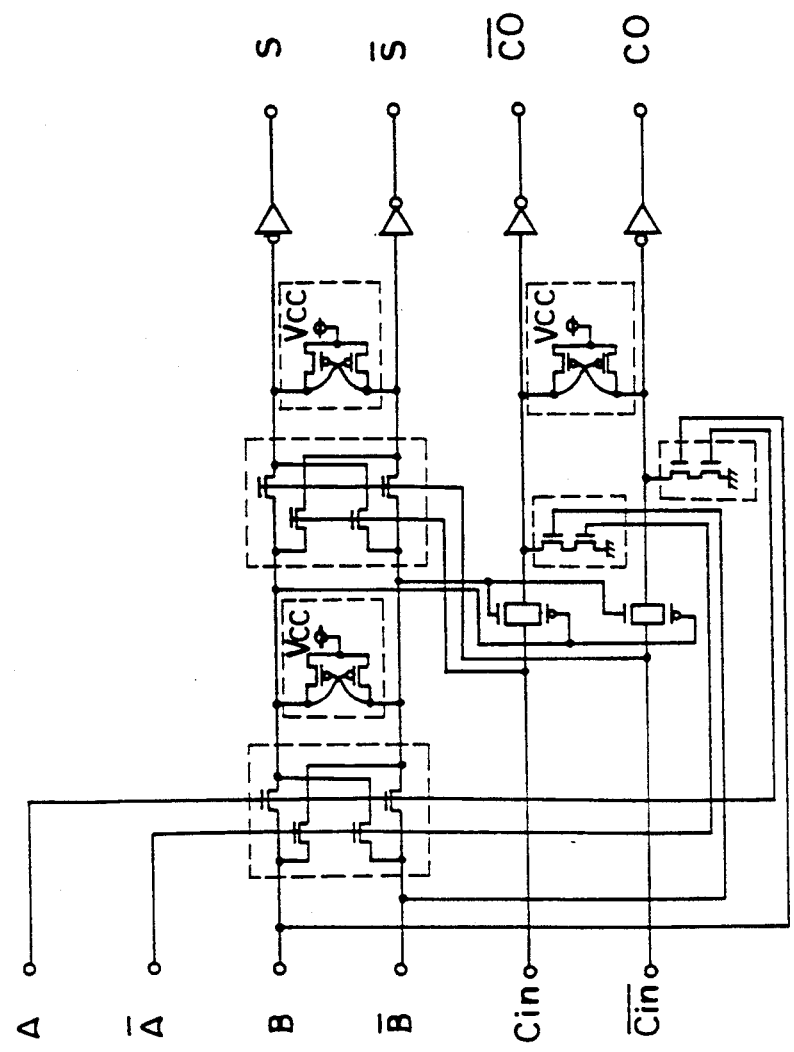
FIG. 8 is a circuit diagram of one example of a full adder receiving a complementary input signal pair.
Figure 9:
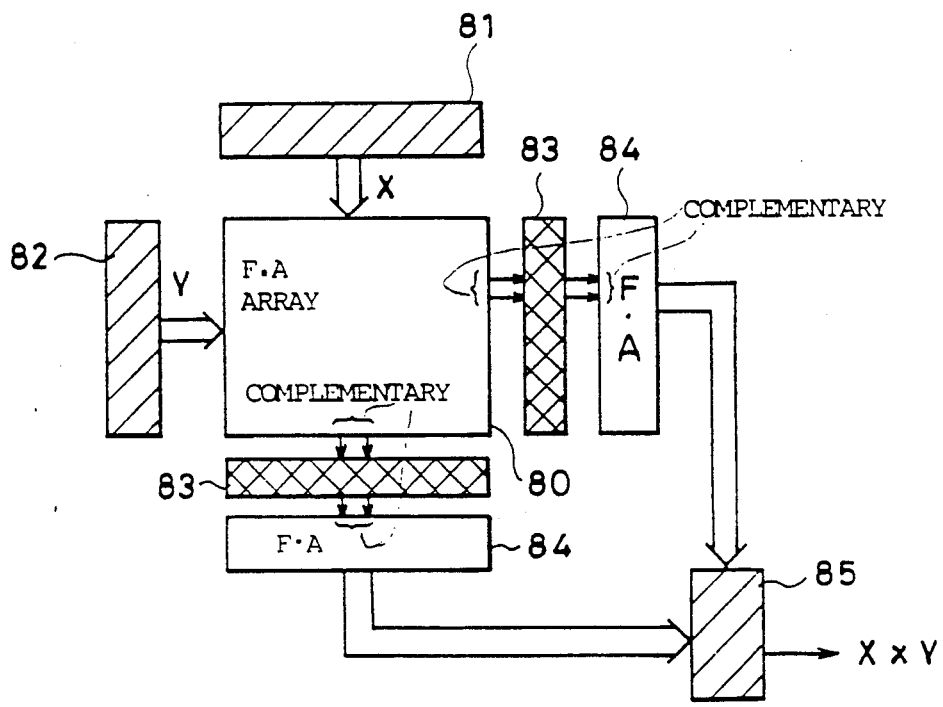
FIG. 9 is a schematic block diagram of the configuration of an integer multiplier.

FIG. 4 is a circuit diagram of a latch circuit of a third embodiment of this invention. Referring to the figure, this latch circuit comprises data amplifying inverters 1 and 2 for amplifying each of the complementary input data signal pair D and $\overline{D}$, a data holding portion 29c for holding input data signals, and data amplifying inverters 3 and 4 for inverting and amplifying each of two output signals derived from the data holding portion 29c and for inputting as a complementary output signal pair Q and $\overline{Q}$ to the succeeding stage.

The data holding portion 29c comprises input terminals 5 and 6, output terminals 7 and 8, two-input NOR gates 18 and 19, N channel MOS transistors 10 and 11, a write control terminal 9, a reset signal input terminal 20, and a set signal input terminal 21. The NOR gate 18 has its one input terminal connected to the reset signal input terminal 20, while the NOR gate 19 has its one input terminal connected to the set signal input terminal 21. The NOR gate 18 has its other input terminal connected to the input terminal 5 via the transistor 10, while the NOR gate 19 has its other input terminal connected to the input terminal 6 via the transistor 11. Further, one input terminal of the NOR gate 18 connected to the transistor 10 is connected to the output terminal of the NOR gate 19. Similarly, one input terminal of the NOR gate 19 connected to the transistor 11 is connected to the output terminal of the NOR gate 18. Further, the respective output terminals of the NOR gates 18 and 19 are connected to the output terminals 7 and 8. The write control terminal 9 is connected to the respective gates of the transistors 10 and 11. The respective output terminals of the inverters 1 and 2 are connected to the input terminals 5 and 6, while the respective input terminals of the inverters 3 and 4 are connected to the output terminals 7 and 8.

The operation of this latch circuit will now be described.

First of all, in the data write-in state, the potential level of a signal T applied to the write control terminal 9 goes to the "H" level, so that the transistors 10 and 11 are turned on. Accordingly, a complementary input data signal pair D and $\overline{D}$ inputted to the inverters 1 and 2 are respectively transmitted to nodes e and g. At this time, the signal of the potential level "L" is applied to the reset signal input terminal 20 and set signal input terminal 21. Therefore, the NOR gates 18 and 19 using as one of their inputs operate in the same manner as the inverter. That is to say, the NOR gate 18 inverts the potential level on the node e to output to the node f, while the NOR gate 19 inverts the potential level on the node g to output to the node h. Therefore, the complementary output signals Q and $\overline{Q}$ are transmitted to the circuit at the succeeding stage at the same rate as in the two embodiments previously described.

Next in the data holding state, the potential level of the signal T applied to the write control terminal 9 goes to the "L" level, so that the transistors 10 and 11 are turned off. Accordingly, the data which is written in advance is not rewritten responsive to a signal applied later to the input terminals 5 and 6. Furthermore, the potential levels on the nodes e and g applied responsive to the data inputted in advance are respectively held responsive to the outputs of the NOR gates 19 and 18. The adjustments in the current handling capabilities of the elements are also the same as in the previous two embodiments.

The complementary input data signals D and $\overline{D}$ are respectively derived from the output terminals 7 and 8. The signal derived from the output terminal 7 is inverted and amplified by the inverter 3 and inputted to the succeeding stage as the output signal $\overline{Q}$, while the signal derived from the output terminal 8 is inverted and amplified by the inverter 4 and inputted to the circuit at the succeeding stage as the output signal Q. The NOR gates 18 and 19 have one of their respective input terminals supplied with the reset signal R and the set signal S. Thus, if various combinations of the potential levels "H" and "L" of the reset signal R and the set signal S are provided, signals corresponding to the respective combinations are obtained from the output terminals 7 and 8. For example, if the potential level of the reset signal R is in the "H" level and the potential level of the set signal S is the "L" level, the output potential level on the NOR gate 18 (the potential level on the output terminal 7) goes to the "L" level despite the potential level on the node e. Accordingly, the input potential levels on the NOR gate 19 go to the "L" level and its output potential level (the potential level on the output terminal 8) to the "H" level. That is, the potential levels of the signals derived from the NOR gate to which the potential level "H" is applied as the reset signal R or the set signal S always go to the "L" level. This means that the data held in the node f or h is reset. As describe above, the input data signals can be set and reset responsive to the reset signal R and the set signal S in this embodiment. (However, there is no case that the potential levels of the reset signal R and reset signal S are both the "H" level). The transmission gate may be employed which is constituted by the P channel MOS transistor, or the P channel MOS transistor and N channel MOS transistor as the switching means for switching the data write-in state and the data holding state in this embodiment.

Since the latch circuit according to the present invention described heretofore can very rapidly provide the complementary data supplied to the input terminals to the output terminals in data writing, employing this latch circuit for the circuit requiring the complementary signal propagation as represented by the multiplier operating at a very high speed results in an increase in the operation speed (the signal transmission rate) of the circuit requiring the complementary signal propagation.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A logic signal storage and transmission circuit having a pair of complementary input terminals for receiving complementary input signals and a pair of complementary output terminals for providing corresponding complementary output signals, said logic signal storage and transmission circuit being a data latch circuit for use in a multiplier and the like, for transmitting a complementary signal pair at high speed, and comprising:

interconnection means for establishing first and second signal flow paths respectively between the pairs of complementary input and output terminals;

data holding means in said interconnection means for holding a complementary data pair from said pair of complementary input terminals including first inverting means receiving one of said complementary data pair for inverting the data thereof and second inverting means receiving the other one of said complementary data pair for inverting the data thereof, an output of said first inverting means being coupled to an input of said second inverting means and one of said complementary output terminals with no intervening circuit elements, and an output of said second inverting means being coupled to an input of said first inverting means and the other of said complementary output terminals with no intervening circuit elements; and means for controlling said data holding means for latching said complementary data pair in response to a first state of a control signal and for transmitting said complementary input signals received at said complementary input terminals to respective said complementary output terminals in response to a second state of the control signal, said means for controlling including a pair of control gates for controlling data input timing and a control input terminal for receiving the control signal for controlling the pair of control gates; wherein each of the complementary input terminals is respectively connected between a corresponding data input terminal and a corresponding input terminal of one of the control gates, said control input terminal is connected in common to both control signal input terminals of said pair of control gates, and output terminals of said pair of control gates are respectively connected to corresponding inputs of said first and second inverting means.

2. A logic signal storage and transmission circuit in accordance with claim 1, wherein said first and second transmission gate means each comprises one MOS transistor, a gate terminal of the MOS transistor of each of said first and second transmission gate means being connected to said control signal input terminal.

3. A logic signal storage and transmission circuit in accordance with claim 2, wherein a conductivity type of said one MOS transistor is N type.

4. A logic signal storage and transmission circuit in accordance with claim 2, wherein a conductivity type of said one MOS transistor is P type.

5. A logic signal storage and transmission circuit in accordance with claim 1, wherein said first transmission gate means comprises a first conductivity type MOS transistor and a second conductivity type MOS transistor having respective sources connected in common and respective drains connected in common, said second transmission gate comprising a first conductivity type MOS transistor and a second conductivity type MOS transistor having respective sources connected in common and respective drains connected in common, said control signal input terminal comprising a first input terminal receiving a first control signal, and a second input terminal receiving a second control signal being complementary with said first control signal, the respective gates of the first conductivity type MOS transistors of said first and second transmission gate means being connected to each other and connected to said first input terminal, the respective gates of the second conductivity type MOS transistor of said first and second transmission gate means being connected to each other and connected to said second input terminal.

6. A logic signal storage and transmission circuit in accordance with claim 5, wherein said first conductivity type is N type, and said second conductivity type is P type.

7. A logic signal and storage transmission circuit in accordance with claim 1, wherein said data holding means comprises first and second NOR circuits each having two inputs; and wherein said means for controlling said data holding means comprises first transmission gate means connected between one of the complementary data pair, which is transmitted from one of said complementary input terminals, and one input of said first NOR circuit, second transmission gate means connected between the other data from the other input terminal and one input of said second NOR circuit, and a control signal input terminal connected in common to said first and second transmission gate means for receiving a control signal for controlling ON/OFF thereof, an output of said first NOR circuit being connected to said one input of said second NOR circuit, an output of said second NOR circuit being connected to said one input of said first NOR circuit, the other input of said first NOR circuit being connected to a first external control input terminal, the other input of said second NOR circuit being connected to a second external control input terminal.

8. A logic signal storage and transmission circuit for use in a multiplier and the like, for transmitting a complementary signal pair at high speed, and comprising:

a complementary signal input terminal pair receiving a complementary data pair, a complementary signal output terminal pair outputting a complementary signal, a first inverter circuit having an input connected to one terminal of said complementary signal input terminal pair, and a second inverter circuit having an input connected to the other terminal of said complementary signal input terminal pair, an output of said first inverter circuit being connected to one terminal of said complementary signal output terminal pair with no intervening circuit elements, an output of said second inverter circuit being connected to the other terminal of said complementary signal output terminal pair with no intervening circuit elements, the input of said first inverter circuit being connected to the output of said second inverter circuit with no intervening circuit elements, the input of said second inverter circuit being connected to the output of said first inverter circuit with no intervening circuit elements, said logic signal storage and transmission circuit further comprising:
- a first MOS transistor connected between said one terminal of said complementary signal input terminal pair and the input of said first inverter circuit,
- a second MOS transistor connected between said other terminal of said complementary signal input terminal pair and the input of said second inverter circuit,
- said first MOS transistor having the same conductivity type as that of said second MOS transistor, and
- a control signal input terminal connected in common to the gates of said first and second MOS transistors for receiving a control signal for controlling ON/OFF thereof, wherein said complementary data pair is latched when said transmission gates are OFF and said complementary data pair received at said complementary signal input terminal pair is transmitted to respective said complementary output terminal pair when said transmission gates are ON.

9. A logic signal storage and transmission circuit being a data latch circuit for use in a multiplier and the like, for transmitting a complementary signal pair at high speed, and provided between first full adder means for outputting a complementary data pair and second full adder means for receiving the complementary data pair as an input, and having complementary input terminals for receiving complementary input signals and complementary output terminals for outputting complementary output signals corresponding to said complementary input signals, said complementary input terminals being coupled to an output of said first full adder means, said complementary output terminals being coupled to an input of said second full adder means, said logic signal storage and transmission circuit further comprising:
- interconnection means for establishing first and second signal flow paths respectively between said complementary input and output terminals;
- data holding means in said interconnection means for holding the complementary data pair from said input terminals including first inverting means receiving one of said complementary data pair for inverting the data thereof and second inverting means receiving the other one of said complementary data pair for inverting the data thereof, an output of said first inverting means being coupled to an input of said second inverting means and one of said complementary output terminals with no intervening circuit elements, and an output of said second inverting means being coupled to an input of said first inverting means and the other of said complementary output terminals with no intervening circuit elements; and
- means for controlling said data holding means for latching said complementary data pair in response to a first state of a control signal and for transmitting said complementary input signals received at said complementary input terminals to respective said complementary output terminals in response to a second state of the control signal, said means for controlling including a pair of control gates for controlling data input timing and a control input terminal for receiving the control signal for controlling the pair of control gates; wherein
- each of the complementary input terminals is respectively connected between a corresponding data input terminal and a corresponding input terminal of one of the control gates,
- said control input terminal is connected in common to both control signal input terminals of said pair of control gates, and
- output terminals of said pair of control gates are respectively connected to corresponding inputs of said first and second inverting means.

10. A logic signal storage and transmission circuit, provided in multiplier means comprising partial product evaluating means for evaluating partial products of first numeric value data and second numeric value data and outputting the partial products as a complementary data pair, and partial product sum evaluating means for evaluating a sum of said partial products in response to input data, and evaluating a product of said first numeric value data and said second numeric value data; said logic signal storage and transmission circuit comprising
- complementary input terminals for receiving complementary input signals, and complementary output terminals for outputting complementary output signals corresponding to said complementary input signals;
- said complementary input terminals being coupled to an output of said partial product evaluating means,
- said complementary output terminals being coupled to an input of said partial product sum evaluating means,
- interconnection means for establishing first and second signal flow paths respectively between said complementary input and output terminals;
- data holding means in said interconnection means for holding the complementary data pair from said input terminals including first inverting means receiving one of said complementary data pair for inverting the data thereof and second inverting means receiving the other one of said complementary data pair for inverting the data thereof, an output of said first inverting means being directly coupled to an input of said second inverting means and one of said complementary output terminals, and an output of said second inverting means being directly coupled to an input of said first inverting means and the other of said complementary output terminals; and
- means for controlling said data holding means for latching said complementary data pair in response to a first state of a control signal and for transmitting said complementary input signals received at said complementary input terminals to respective said complementary output terminals in response to a second state of the control signal.

* * * * *

UNITED STATES PATENT AND TRADEMARK OFFICE
CERTIFICATE OF CORRECTION

PATENT NO. : 5,173,870

DATED : December 22, 1992

INVENTOR(S) : Sukashita et al

It is certified that error appears in the above-identified patent and that said Letters Patent is hereby corrected as shown below:

On the title page, at [75], the inventor name

"Yoshiki Tsujzhushi" should be --Yoshiki Tsujihashi--

Signed and Sealed this

Second Day of November, 1993

Attest:

BRUCE LEHMAN

Attesting Officer

Commissioner of Patents and Trademarks